United States Patent
Nakaoka et al.

(10) Patent No.: US 6,861,375 B1
(45) Date of Patent: Mar. 1, 2005

(54) METHOD OF FABRICATING SEMICONDUCTOR DEVICE

(75) Inventors: Hiroaki Nakaoka, Kyoto (JP); Atsushi Ishinaga, Osaka (JP); Hiroko Kubo, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/640,519

(22) Filed: Aug. 17, 2000

(30) Foreign Application Priority Data

Aug. 24, 1999 (JP) ............................................. 11-236792

(51) Int. Cl.$^7$ ............................................. H01L 21/31
(52) U.S. Cl. ...................................... 438/775; 438/287
(58) Field of Search ............................ 438/96–97, 216, 438/287, 591, 769, 762–763, 750, 775, 786, 954, 486, 585, 3, 770; 257/344; 437/69, 70, 72, 73, 241, 247

(56) References Cited

U.S. PATENT DOCUMENTS

| | | | | | |
|---|---|---|---|---|---|
| 5,541,436 | A | * | 7/1996 | Kwong et al. | 257/410 |
| 5,707,889 | A | * | 1/1998 | Hsu et al. | 437/69 |
| 5,712,208 | A | * | 1/1998 | Tseng et al. | 438/770 |
| 5,817,562 | A | * | 10/1998 | Chang et al. | 438/305 |
| 5,821,172 | A | * | 10/1998 | Gilmer et al. | 438/769 |
| 6,040,216 | A | * | 3/2000 | Sung | 438/257 |
| 6,127,227 | A | * | 10/2000 | Lin et al. | 438/261 |
| 6,136,728 | A | * | 10/2000 | Wang | 438/773 |
| 6,144,071 | A | * | 11/2000 | Gardner et al. | 257/344 |
| 6,162,687 | A | * | 12/2000 | Gardner et al. | 438/287 |
| 6,211,003 | B1 | * | 4/2001 | Taniguchi et al. | 438/228 |
| 6,215,163 | B1 | * | 4/2001 | Hori et al. | 257/411 |
| 6,232,187 | B1 | * | 5/2001 | Kuroi et al. | 438/287 |
| 6,245,689 | B1 | * | 6/2001 | Hao et al. | 438/769 |
| 6,246,091 | B1 | * | 6/2001 | Rodder | 257/335 |
| 6,252,296 | B1 | * | 6/2001 | Umeda et al. | 257/639 |
| 6,323,519 | B1 | * | 11/2001 | Gardner et al. | 257/336 |
| 6,380,056 | B1 | * | 4/2002 | Shue et al. | 438/591 |
| 6,391,732 | B1 | * | 5/2002 | Gupta et al. | 438/305 |

FOREIGN PATENT DOCUMENTS

| | | |
|---|---|---|
| JP | 10-64915 | 3/1998 |
| WO | WO 98/10464 | 3/1998 |

OTHER PUBLICATIONS

Lai, et al., "A Comparison Between No–Annealed $O_\tau$ and $N_2O$–Grown Gate Dielectrics", Proceedings 1998 IEEE Hong Kong Electron Devices Meeting, pp. 36–39, Aug. 29, 1998, China.

Lin, et al., "Leakage Current, Reliability Characteristics, and Boron Penetration of Ultra–Thin (32–36Å)$O2$–Oxides and $N_2O/NO$ Oxynitrides", IEDM 96, pp. 331–334, 1996.

Sun, et al., "MOS Characteristics of $N_2O$–Grown and NO–Annealed Oxynitrides", 4$^{TH}$ International Technology Proceedings, pp. 90–92, Nov. 1995.

Notice of Reasons of Rejection dated Dec. 24, 2003.

* cited by examiner

Primary Examiner—David Nelms
Assistant Examiner—David Vu
(74) Attorney, Agent, or Firm—Nixon Peabody LLP; Donald R. Studebaker

(57) ABSTRACT

A silicon oxynitride film is formed on a substrate. Then, a heat treatment is performed, while keeping a surface of the silicon oxynitride film in contact with a gas containing nitrogen, such as an NO gas, to introduce at least nitrogen into the silicon oxynitride film and produce a steeply sloped distribution of nitrogen. A semiconductor film containing an impurity, such as an amorphous silicon film, is formed on the silicon oxynitride film. By forming a CMOS device with, in particular, a dual gate structure which comprises p-type and n-type MIS transistors each having a gate oxide film composed of the silicon oxynitride film and a gate electrode composed of a polysilicon film, a high driving force is provided, while boron penetration in the p-type MIS transistor is suppressed.

7 Claims, 7 Drawing Sheets

METHOD OF FABRICATING SEMICONDUCTOR DEVICE

BACKGROUND OF THE INVENTION

The present invention relates to a MIS transistor having a polysilicon gate electrode provided on a gate insulating film and, more particularly, to an improvement in the driving force thereof.

Doping of the gate electrode of a MOS transistor with an impurity has been performed conventionally and commonly to reduce the resistance of the gate electrode and thereby improve the driving force of the MOS transistor. In particular, a CMOS device typically has a so-called dual gate structure in which the gate electrode of an n-channel MOS transistor is doped with an n-type impurity (phosphorus or arsenic) and the gate electrode of a p-channel MOS transistor is doped with a p-type impurity (boron).

However, since boron as the p-type impurity is particularly likely to be diffused in an oxide film, a phenomenon of so-called "boron penetration" is observed in which boron passes through the gate oxide film to enter the channel region of a Si substrate, which depletes the gate electrode. This causes the disadvantages of a lower driving force of the p-channel MOS transistor, degraded subthreshold characteristics, and aggravated short-channel effects.

To prevent these disadvantages, there has been used a technique for suppressing downward diffusion of boron by composing the gate insulating film of a silicon oxynitride film. In using the technique, there has commonly adopted a method of forming a silicon oxynitride film directly on a silicon substrate by performing a heat treatment, while allowing a gas mixture of oxygen and NO or an $N_2O$ gas to flow over the silicon substrate, or a method of changing a silicon oxide film already formed into a silicon oxynitride film by allowing an $N_2O$ gas or $NH_3$ gas to flow over the silicon oxide film and thereby introducing nitrogen into the silicon oxide film.

However, as the gate length of a transistor becomes shorter with the increasing miniaturization and higher integration of a CMOS device currently pursued, a gate insulating film is also reduced in thickness to provide a sufficient driving force despite a reduction in voltage, which has caused the problem that a transistor with a sufficient driving force is not provided even if the gate insulating film is composed of a silicon oxynitride film.

Although the cause thereof has not been determined yet with certainty, the present inventors have experimentally assumed that an insufficient driving force is attributable to a mechanism other than the depletion of a gate electrode and, in particular, to a poor state of nitrogen distribution in the silicon oxynitride film as the gate insulating film.

SUMMARY OF THE INVENTION

It is therefore an object of the present invention to provide a method of fabricating a semiconductor device with a large driving force, such as a MIS transistor, while suppressing downward penetration of an impurity from a gate insulating film of the MIS transistor having a gate electrode doped with the impurity.

A method of fabricating a semiconductor device according to the present invention comprises the steps of: (a) forming a silicon oxynitride film on a substrate; (b) performing a heat treatment, while keeping a surface of the silicon oxynitride film in contact with a gas containing nitrogen, to introduce at least nitrogen into the silicon oxynitride film; and (c) forming a semiconductor film containing an impurity on the silicon oxynitride film.

In accordance with the method, nitrogen can be introduced additionally such that a nitrogen distribution having a steeply sloped configuration is produced in the silicon oxynitride film. This suppresses the entrance of nitrogen into the semiconductor film and the substrate, while suppressing the penetration of the impurity from the semiconductor film into the substrate. This allows a device formed by using the semiconductor film and the silicon oxynitride film to retain excellent characteristics. In a MIS transistor, e.g., a reduction in driving force assumedly caused by the penetration of nitrogen into the gate electrode or the semiconductor substrate can be suppressed, while the penetration of the impurity from the gate electrode composed of the semiconductor film into the semiconductor substrate is suppressed. In summary, the suppression of the short-channel effects resulting from the penetration of the impurity is achievable simultaneously with an improvement in the driving force of the transistor.

In the method of fabricating a semiconductor device, the silicon oxynitride film is preferably formed by using an $N_2O$ gas in the step (a).

In the method of fabricating a semiconductor device, the step (c) preferably includes the substeps of: forming, as the semiconductor film, an amorphous silicon film on the silicon oxynitride film; implanting impurity ions into the amorphous silicon film; and performing a heat treatment for activating the impurity to change the amorphous film into a polysilicon film. This suppresses the penetration of the impurity into the substrate underlying the silicon oxynitride film by using a high impurity holding capability of the amorphous silicon film.

In the method of fabricating a semiconductor device, the heat treatment is preferably performed at 800 to 1050° C. in the step (b).

In the method of fabricating a semiconductor device, a gas containing nitrogen and oxygen is preferably used as the gas containing nitrogen in the step (b).

In that case, it was found that a particularly large effect was achievable by using an NO gas as the gas containing nitrogen.

Alternatively, an $N_2O$ gas can also be used as the gas containing nitrogen.

In the method of fabricating a semiconductor device, if the semiconductor device is a p-channel MIS transistor, a MIS transistor having a high driving force suitable for a CMIS device with a dual gate structure is obtainable by forming a gate electrode containing boron in the step (c).

DETAILED DESCRIPTION OF THE INVENTION

FIGS. 1(a) to (e) and FIGS. 2(a) to (c) are cross-sectional views illustrating the process of fabricating a semiconductor device (CMOS device) according to an embodiment of the present invention. Throughout the drawings, Rp denotes a region in which a p-channel MIS transistor is to be formed and Rn denotes a region in which an n-channel MIS transistor is to be formed.

Figure 1A:
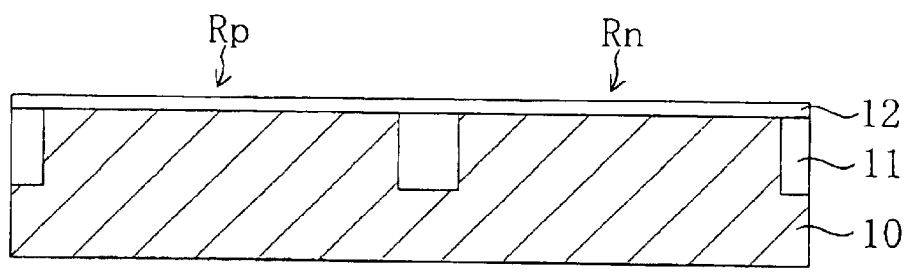
FIGS. 1(*a*) to (*e*) are cross-sectional views illustrating the first half steps of the process of fabricating a semiconductor device according to an embodiment of the present invention.

In the step shown in FIG. 1(a), trench isolation regions 11 surrounding the p-channel MIS transistor formation region Rp and the n-channel MIS transistor formation region Rn are formed in a Si substrate 10. Then, the Si substrate 10 is kept in contact with an $N_2O$ gas at a temperature of about 1000° C. for about 60 sec, whereby a silicon oxynitride film 12 with a thickness of 2.8 nm is formed on the substrate 10.

It is to be noted that the method of forming the silicon oxynitride film is not limited thereto. For example, it is also possible to perform a heat treatment at about 1000° C., while keeping the surface of the Si substrate 10 in contact with a gas mixture of an NO gas and an $O_2$ gas. Alternatively, it is also possible to form a silicon oxide film and introduce nitrogen into a surface of the silicon oxide film.

Figure 1B:
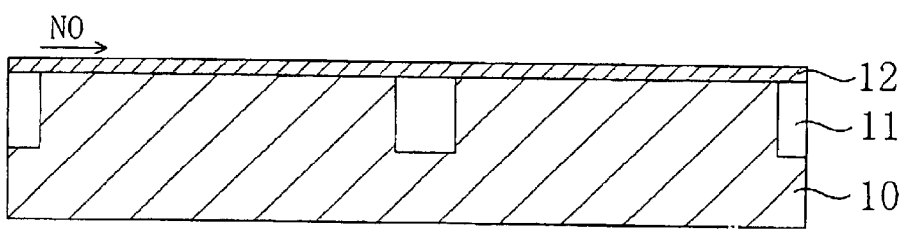

Next, in the step shown in FIG. 1(b), nitrogen (N) is introduced into the interior of the silicon oxynitride film 12 by performing a heat treatment at 900° C. for 30 sec, while keeping the silicon oxynitride film 12 in contact with an NO gas. As a consequence, the state of nitrogen distribution in the silicon oxynitride film 12 changes such that not only nitrogen concentration in the silicon oxynitride film 12 increases but also a peak portion at which nitrogen concentration is maximum exists at a center portion in the direction of thickness of the silicon oxynitride film 12 and the distribution of nitrogen exhibits a steeply sloped configuration.

Figure 1C:
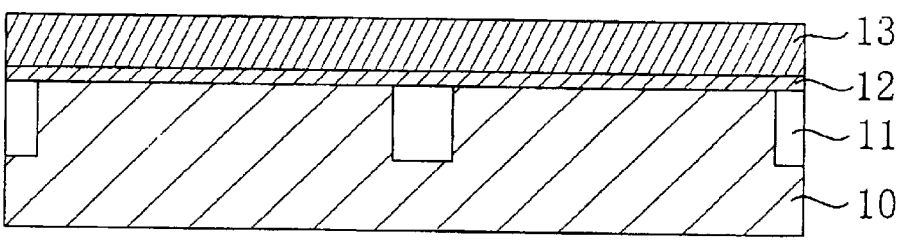

Next, in the step shown in FIG. 1(c), a semiconductor film 13 for gate electrode composed of an amorphous silicon film is deposited on the silicon oxynitride film 12.

Figure 1D:
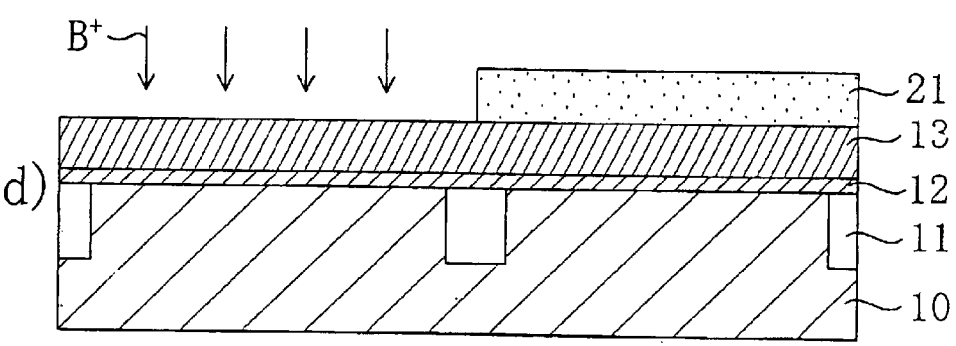

Next, in the step shown in FIG. 1(d), a photoresist film 21 covering the n-channel MIS transistor formation region Rn is formed on the semiconductor film 13 for gate electrode. By using the photoresist film 21 as a mask, boron ions ($B^+$) are implanted into the semiconductor film 13 for gate electrode at an implant energy of 5 keV and a dose of $5 \times 10^{15}/cm^2$, thereby changing, into the p type, the portion of the semiconductor film 13 for gate electrode located in the p-channel MIS transistor formation region Rp.

Figure 1E:
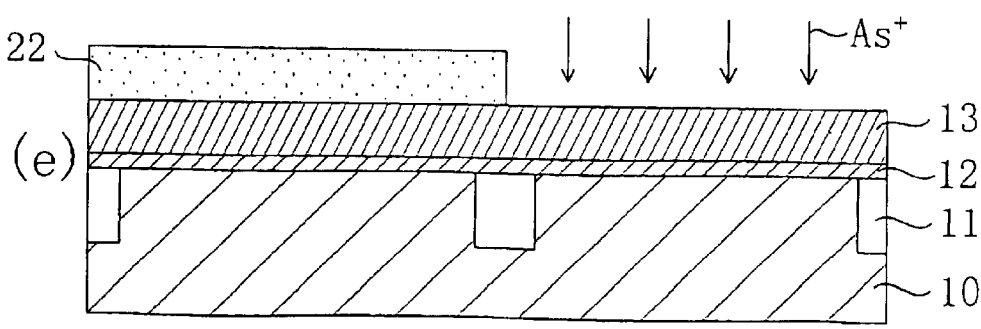

Next, in the step shown in FIG. 1(e), the photoresist film 21 is removed. Then, a photoresist film 22 covering the p-channel MIS transistor formation region Rp is formed on the semiconductor film 13 for gate electrode. By using the photoresist film 22 as a mask, phosphorus ions ($P^+$) are implanted into the semiconductor film 13 for gate electrode at an implant energy of 10 keV and a dose of $7 \times 10^{15}/cm^2$, thereby changing, into the n type, the portion of the semiconductor film 13 for gate electrode located in the n-channel MIS transistor formation region Rn.

Figure 2A:
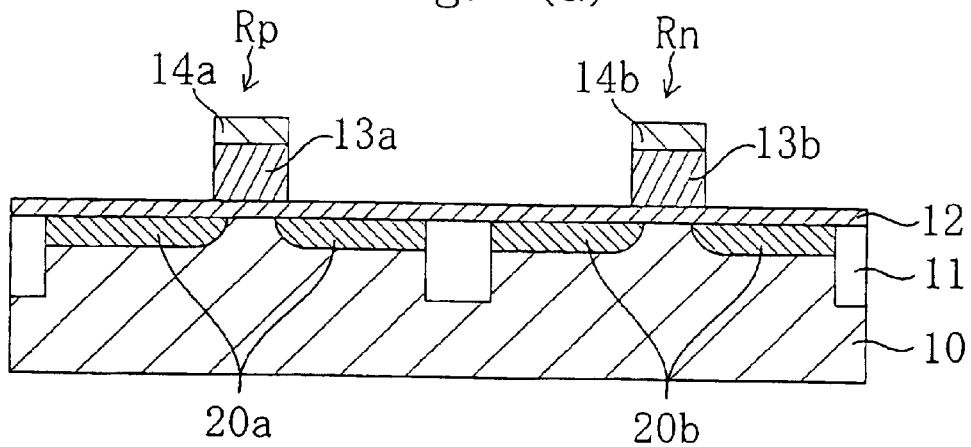
FIGS. 2(*a*) to (*c*) are cross-sectional views illustrating the second half steps of the process of fabricating a semiconductor device according to the embodiment of the present invention.

Next, in the step shown in FIG. 2(a), a silicon nitride film with a thickness of about 150 nm is deposited on the semiconductor film 13 for gate electrode. The silicon nitride film and the polysilicon film are patterned by photolithography and dry etching, thereby forming gate electrodes 13a and 13b and on-gate protective layers 14a and 14b in the p-channel MIS transistor formation region Rp and in the n-channel MIS transistor formation region Rn, respectively. By using the gate electrodes 13a and 13b and the on-gate protective layers 14a and 14b as a mask, boron as a low-concentration p-type impurity is ion implanted into the p-channel MIS transistor formation region Rp, while arsenic as a low-concentration n-type impurity is ion implanted into the n-channel MIS transistor formation region Rn, whereby low-concentration source/drain regions (or extension regions) 20a and 20b are formed in the Si substrate 10.

Figure 2B:
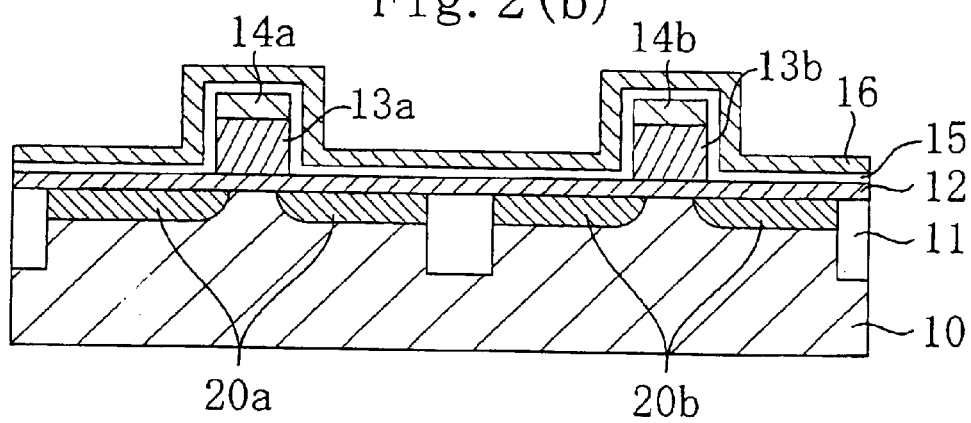

Next, in the step shown in FIG. 2(b), a silicon oxide film 15 with a thickness of about 15 nm and a silicon nitride film 16 with a thickness of about 55 nm are deposited successively.

Figure 2C:
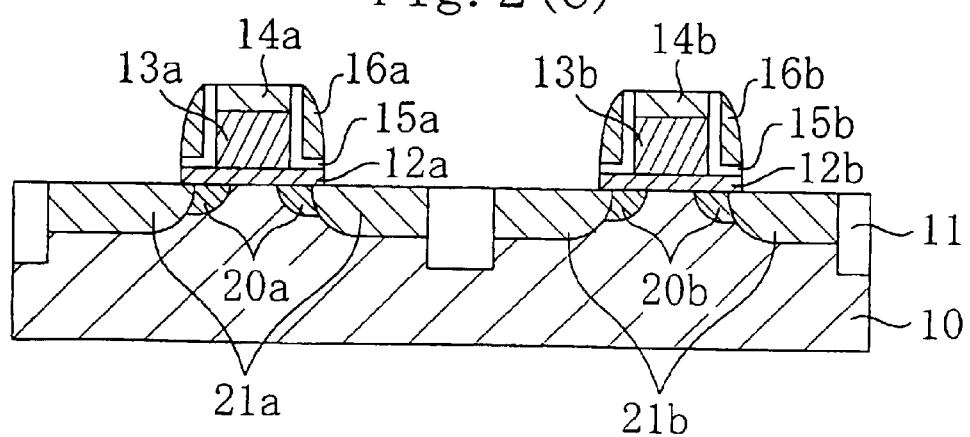

Next, in the step shown in FIG. 2(c), anisotropic etching is performed with respect to the silicon nitride film 16 and the silicon oxide film 15, thereby forming oxide film sidewalls 15a and 15b each having an L-shaped cross section on respective side surfaces of the gate electrodes 13a and 13b and of the on-gate protective layers 14a and 14b and forming nitride film sidewalls 16a and 16b covering the side and bottom surfaces of the oxide film sidewalls 15a and 15b. During the anisotropic etching, the silicon oxynitride film 12 is also patterned to form gate insulating films 12a and 12b made of a silicon oxynitride under the gate electrodes 13a and 13b and the like.

Thereafter, by using the gate electrodes 13a and 13b, the on-gate protective layers 14a and 14b, the oxide film sidewalls 15a and 15b, and the nitride film sidewalls 16a and 16b as a mask, high-concentration boron is ion implanted into the portion of the Si substrate 10 located in the p-channel MIS transistor formation region Rp and high-concentration arsenic is ion implanted into the portion of the Si substrate 10 located in the n-channel MIS transistor formation region Rn, whereby high-concentration source/drain regions 21a and 21b are formed. Subsequently, a heat treatment (RTA) is performed at 1000° C. for 10 sec to activate the impurities in the low-concentration source/drain regions 20a and 20b and in the high-concentration source/drain regions 21a and 21b.

By the foregoing process, there is formed a CMOS device with a so-called dual gate structure in which the conductivity types of the respective impurities contained in the gate electrodes 13a and 13b are coincident with those of the respective channels of the transistors.

Although the depiction of the subsequent fabrication process is omitted, an interlayer insulating film is deposited over the substrate and planarized, contact holes reaching the high-concentration source/drain regions are formed in the interlayer insulating film, and a metal such as W or Al is buried in the contact holes to form metal plugs. A wiring layer is further formed thereon and, if necessary, a multilayer wiring structure is formed by repeating the formation of the interlayer insulating film, the metal plugs, and the wiring layer.

When the heat treatment at a temperature exceeding about 600° C. is performed after the steps shown in FIGS. 1(d) and (e), each of the gate electrodes 13a and 13b (semiconductor film 13 for gate electrode) changes from the amorphous silicon film to the polysilicon film. If the heat treatment for impurity activation is performed immediately after the completion of the step shown in FIG. 1(e), a change from the amorphous silicon film to the polysilicon film occurs. Even if the heat treatment for impurity activation is not performed, there are cases where the change from the amorphous silicon film to the polysilicon film is caused by a CVD process for depositing the silicon oxide film 15 and the silicon nitride film 16 shown in FIG. 2(b) or by the heat treatment for impurity activation in the step shown in FIG. 2(c).

The method of fabricating a semiconductor device according to the present invention is characterized in that annealing (heat treatment) is performed by keeping the silicon oxynitride film 12 in contact with the NO gas in the step shown in FIG. 1(b). It has been found that the treatment increases the nitrogen concentration in the silicon oxynitride film 12 and provides the nitrogen distribution in a steeply sloped configuration. The profile of the nitrogen concentration will be described later. As a result of conducting evaluation, the present inventors have found that such an NO gas annealing process provides the following characteristics which are different from the characteristics of the conventional p-channel MIS transistor.

Figure 3A:
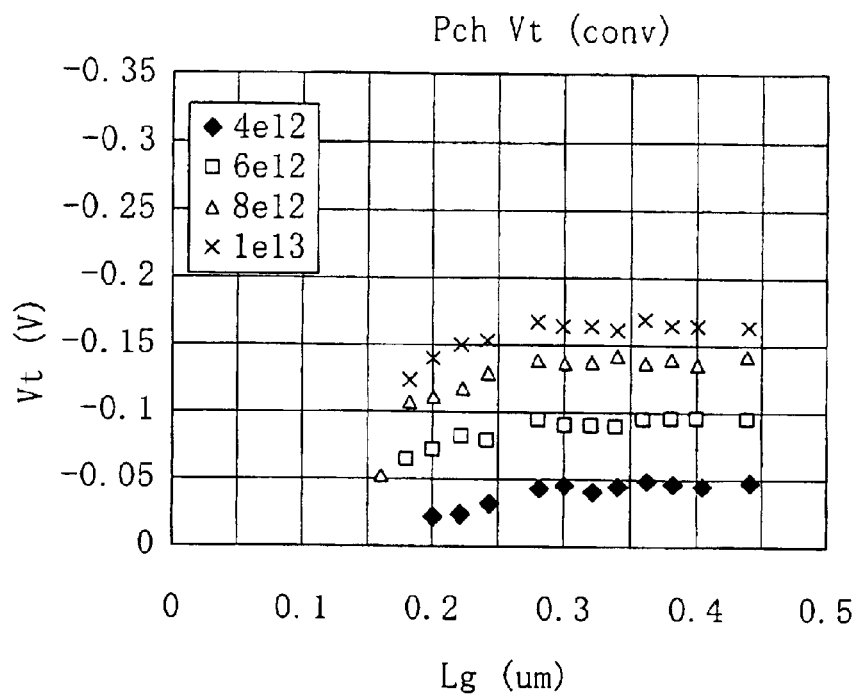
FIG. 3 show respective short-channel characteristics in a conventional p-channel MIS transistor and in a p-channel MIS transistor according to the present embodiment.
Figure 3B:
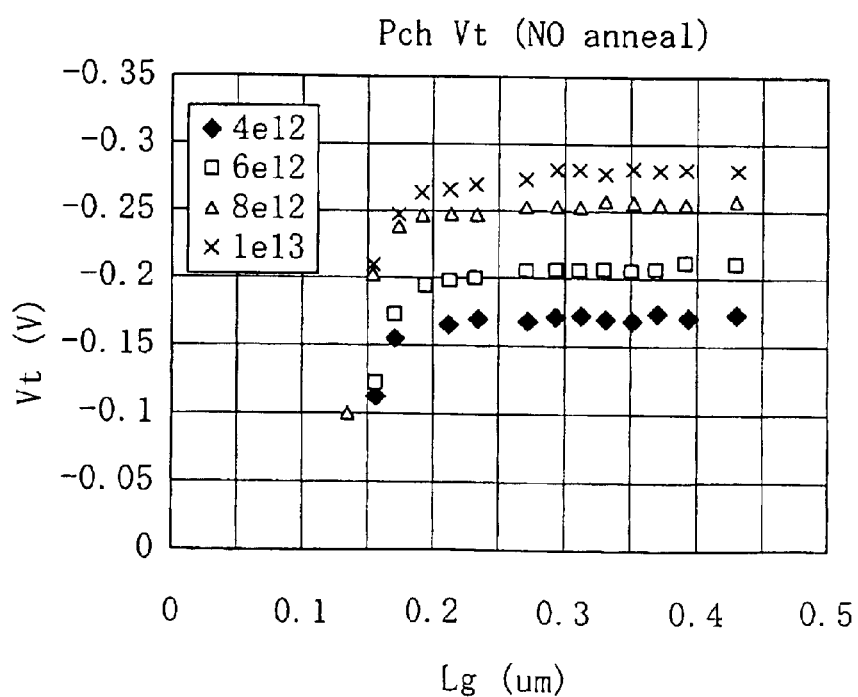

FIG. 3(a) shows the short-channel characteristics of a conventional p-channel MIS transistor and FIG. 3(b) shows the short-channel characteristics of the p-channel MIS transistor according to the present embodiment. The conventional p-channel MIS transistor has the structure shown in FIG. 2(c) in which a silicon oxynitride film that has not been subjected to gas annealing is used as a gate insulating film. In each of FIGS. 3(a) and (b), the horizontal axis represents a gate length ($\mu$m) and the vertical axis represents a threshold voltage (V) The numerals shown in the upper left portions of the FIGS. 3(a) and (b) indicate the dose of ions implanted in the channel region (i.e., the dose of ions implanted for threshold control). For example, "4e12" indicates that the dose of the implanted ions is "$4\times10^{12}/cm^2$".

From the comparison between FIGS. 3(a) and (b), it will be understood that the threshold voltage of the p-channel MIS transistor according to the present embodiment is barely reduced compared with that of the conventional p-channel MIS transistor provided that the gate lengths thereof are the same. This may be because the threshold voltage of the conventional p-channel MIS transistor is reduced by the penetration of boron from the gate electrode into the substrate. By contrast, boron penetration is suppressed effectively in the p-channel MIS transistor according to the present embodiment.

Figure 4A:
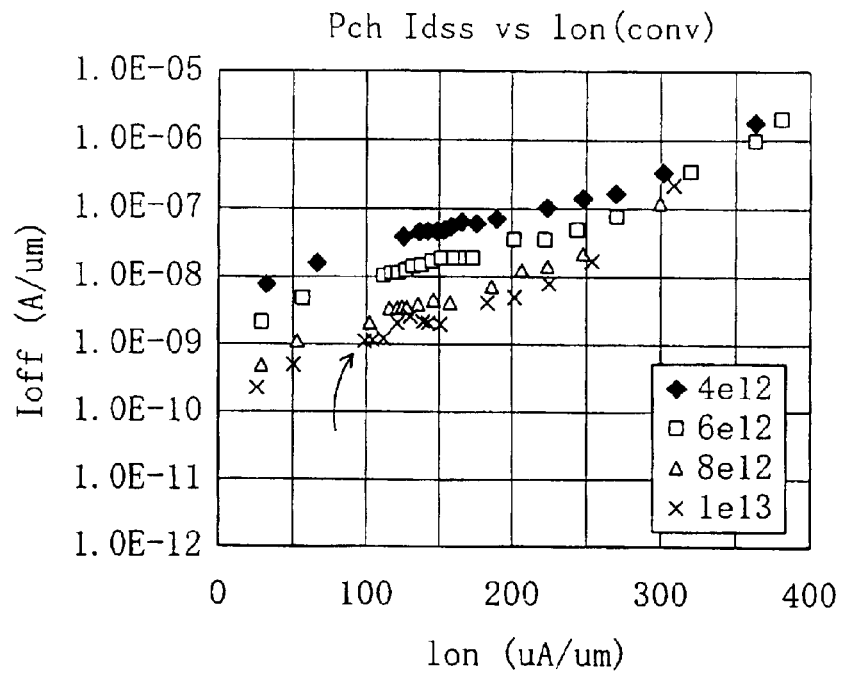
FIG. 4 show respective Ion-Ioff characteristics in the conventional p-channel MIS transistor and in the p-channel MIS transistor according to the present embodiment.
Figure 4B:
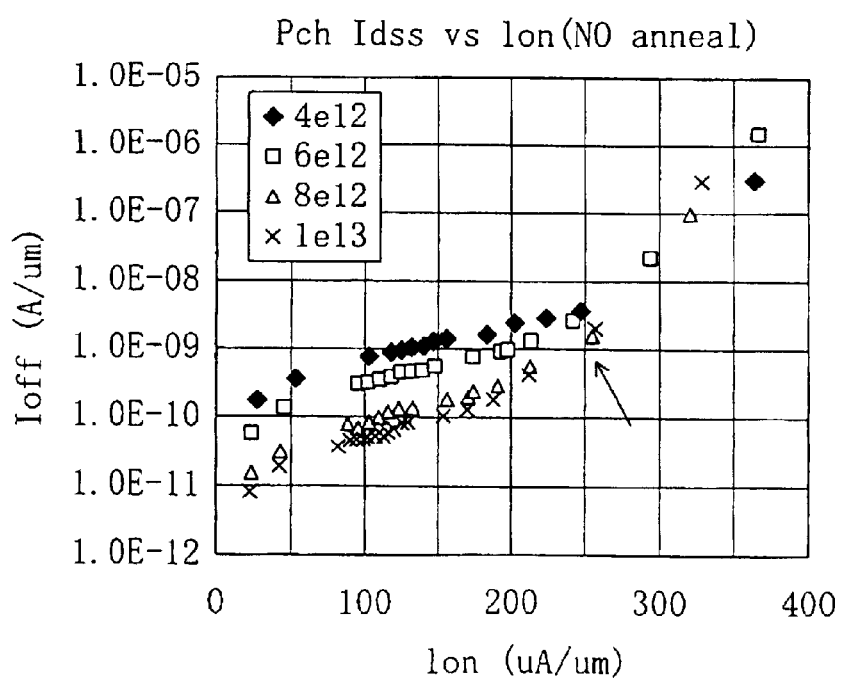

FIG. 4(a) shows the Ion-Ioff characteristics of the conventional p-channel MIS transistor and FIG. 4(b) shows the Ion-Ioff characteristics of the p-channel MIS transistor according to the present embodiment. The conventional p-channel MIS transistor has the structure shown in FIG. 2(c) in which the silicon oxynitride film that has not been subjected to gas annealing is used as the gate insulating film. In each of FIGS. 4(a) and (b), the horizontal axis represents an on-state current Ion ($\mu$A/$\mu$m) and the vertical axis represents an off-state leakage current Ioff (A/$\mu$m). Each of Ion and Ioff indicates a source-to-drain current. The numerals, such as "4e12", shown in the upper left portions indicate the same as described above.

As shown in FIG. 4(a), if the threshold voltage of the p-channel MIS transistor with the conventional structure is adjusted such that the off-state leakage current Ioff is 1 nA/$\mu$m (per unit gate width) when the concentration of the impurity for threshold control is varied, the on-state current Ion is about 100 ($\mu$A/$\mu$m) (see the arrow in FIG. 4(a)). On the other hand, if the threshold voltage of the p-channel MIS transistor according to the present embodiment is adjusted such that the off-state leakage current Ioff is 1 nA/$\mu$m (per unit gate width) when the concentration of the impurity for threshold control is varied, the on-state current Ion is about 250 ($\mu$A/$\mu$m) (see the arrow in FIG. 4(b)). In summary, the p-channel MIS transistor according to the present embodiment has higher on-off characteristics and a larger driving force.

Figure 5:
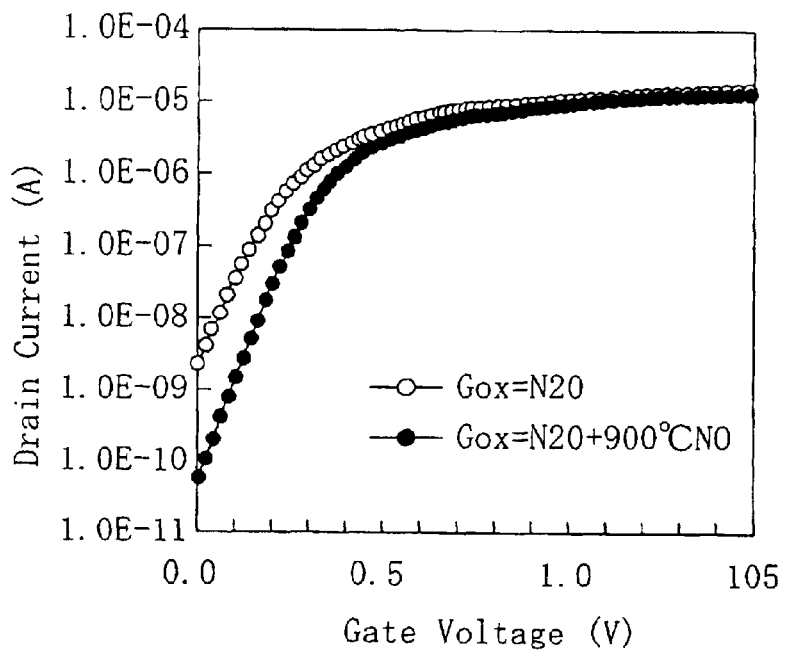
FIG. 5 shows respective subthreshold characteristics in the conventional p-channel MIS transistor and in the p-channel MIS transistor according to the present embodiment.

FIG. 5 shows the respective subthreshold characteristics (Vg-Id characteristics) of the conventional p-channel MIS transistor and the p-channel MIS transistor according to the present embodiment. The conventional p-channel MIS transistor has the structure shown in FIG. 2(c) in which the silicon oxynitride film that has not been subjected to gas annealing is used as the gate insulating film. In FIG. 5, the horizontal axis represents a gate voltage Vg (V) and the vertical axis represents a drain current Id (A).

As can be seen from FIG. 5, the p-channel MIS transistor according to the present embodiment has a smaller off-state leakage current and a Vg-Id characteristic curve with sharper inclination. From the results of the experiments, it will be understood that the p-channel MIS transistor according to the present embodiment has superior on-off characteristics.

Figure 6:
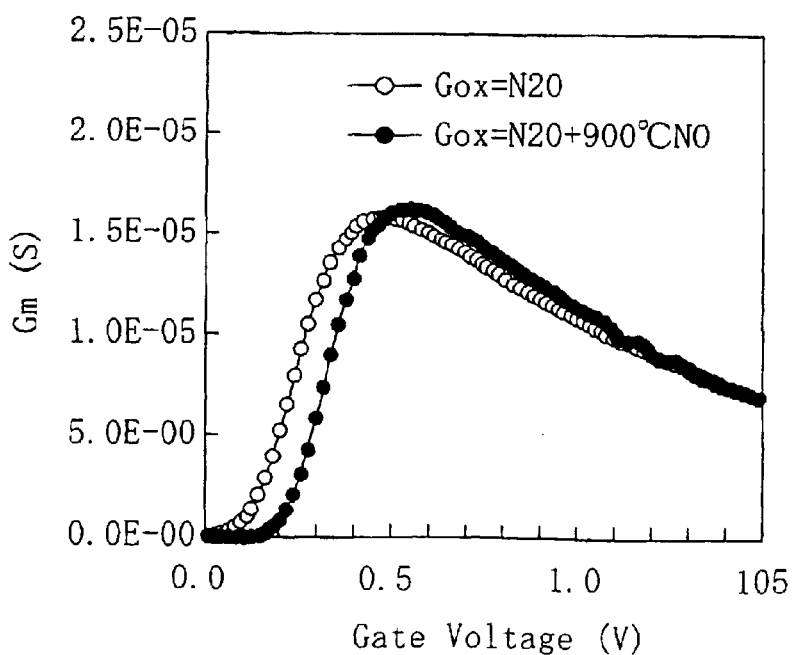
FIG. 6 shows respective transconductance characteristics in the conventional p-channel MIS transistor and in the p-channel MIS transistor according to the present embodiment.

FIG. 6 shows the respective transconductance characteristics (Gm-Vg characteristics) of the conventional p-channel MIS transistor and the p-channel MIS transistor of the present embodiment. The conventional p-channel MIS transistor has the structure shown in FIG. 2(c) in which the silicon oxynitride film that has not been subjected to gas annealing is used as the gate insulating film. In FIG. 6, the horizontal axis represents a gate voltage Vg (V) and the vertical axis represents a transconductance Gm (S).

As can be seen from FIG. 6, the p-channel MIS transistor according to the present embodiment has transconductance with a larger maximum value, i.e., superior switching properties.

A consideration will be given to the reason that the driving force of the p-channel MIS transistor is improved by the fabrication method according to the present embodiment.

A conventional silicon oxynitride film is formed by the same treatment as performed in the step shown in FIG. 1(a). That is, the conventional silicon oxynitride film is formed by, e.g., performing a heat treatment at a temperature of about 1000° C., while keeping a Si substrate in contact with a gas mixture of NO and $O_2$ (or an $N_2O$ gas) or by performing a heat treatment (RTA) at a temperature of about 1000° C., while keeping a silicon oxide film in contact with $N_2$ or $NH_3$. However, it has been found that, if the silicon oxynitride film formed by such a treatment is used as a gate insulating film that has been reduced particularly in thickness in recent years, the driving force of a p-channel MIS transistor is reduced disadvantageously.

Although the cause thereof has not been determined yet with certainty, it is assumed to be the scattering of carriers caused by an interface state density due to excess nitrogen atoms present at an interface immediately overlying a channel region, an increase in dangling voids resulting from the breakage of bonds in a silicon oxide film by nitrogen atoms, or an increase in gate resistance due to excess nitrogen atoms present in a gate electrode.

If the amount of nitrogen introduced into the silicon oxide film is reduced, the penetration of boron from the gate electrode into the channel region cannot be prevented reliably, so that the gate electrode is depleted to reduce the driving force or aggravate short-channel effects including a reduction in threshold voltage. Thus, it is difficult to simultaneously achieve an improvement in the driving force of the transistor and the suppression of the short-channel effects so that, under present circumstances, a trade-off therebetween is determined individually for a CMOS device depending on the type thereof.

However, the present inventors found experimentally that, if the heat treatment was performed while the surface of the silicon oxynitride film was exposed to the NO gas (NO gas annealing), the suppression of the short-channel effects was achievable simultaneously with improvements in the driving force of the transistor (including an improvement in on-off characteristics and an improvement in transconductance). The present inventors further examined changes that had been caused by the NO gas annealing in distributions of nitrogen concentration in the individual portions of the transistor.

Figure 7:
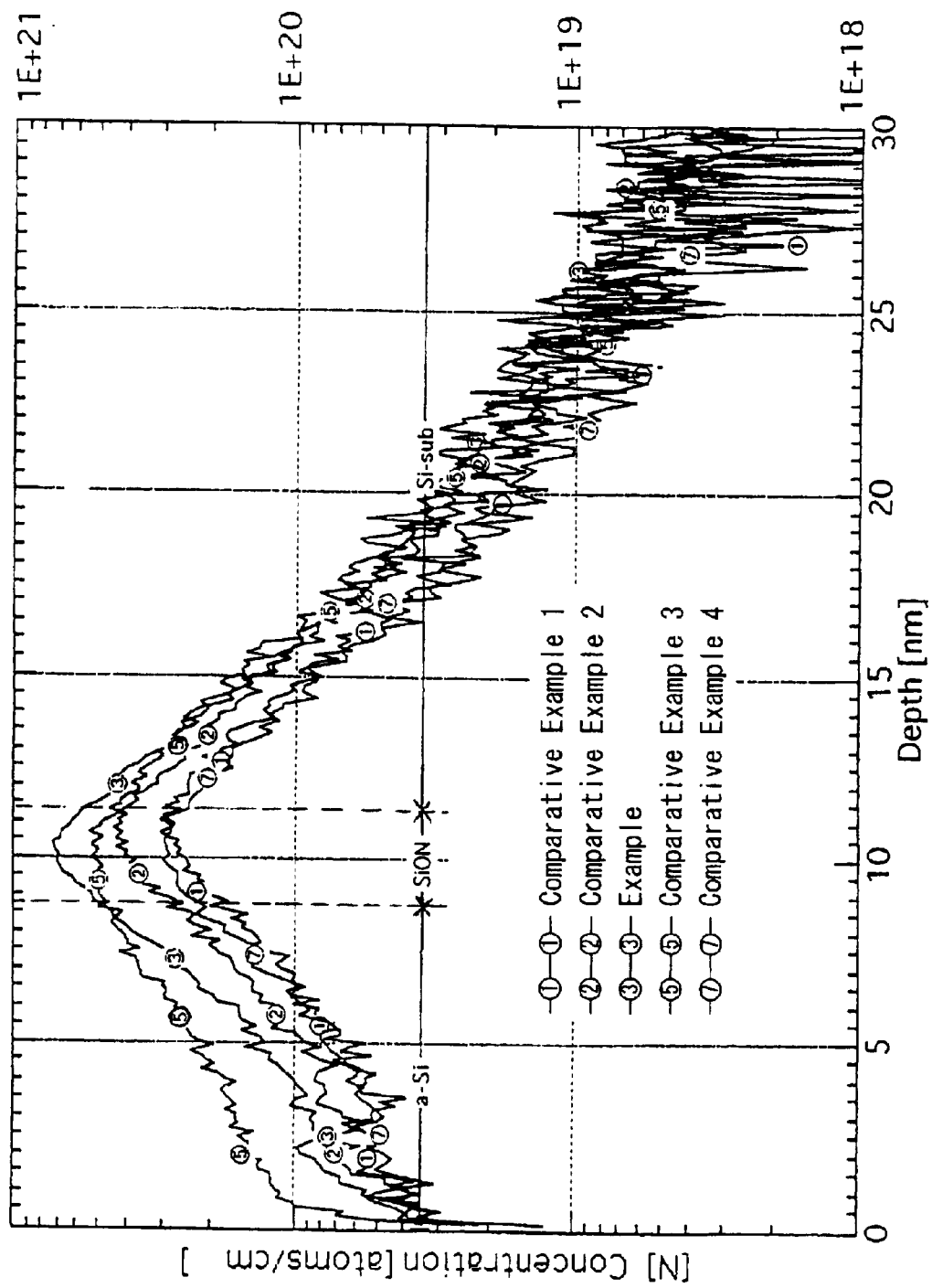
FIG. 7 shows, on a logarithmic scale, the results of measuring, by SIMS, the distributions of nitrogen concentration in silicon oxynitride films and their vicinities according to Example and Comparative Examples.
Figure 8:
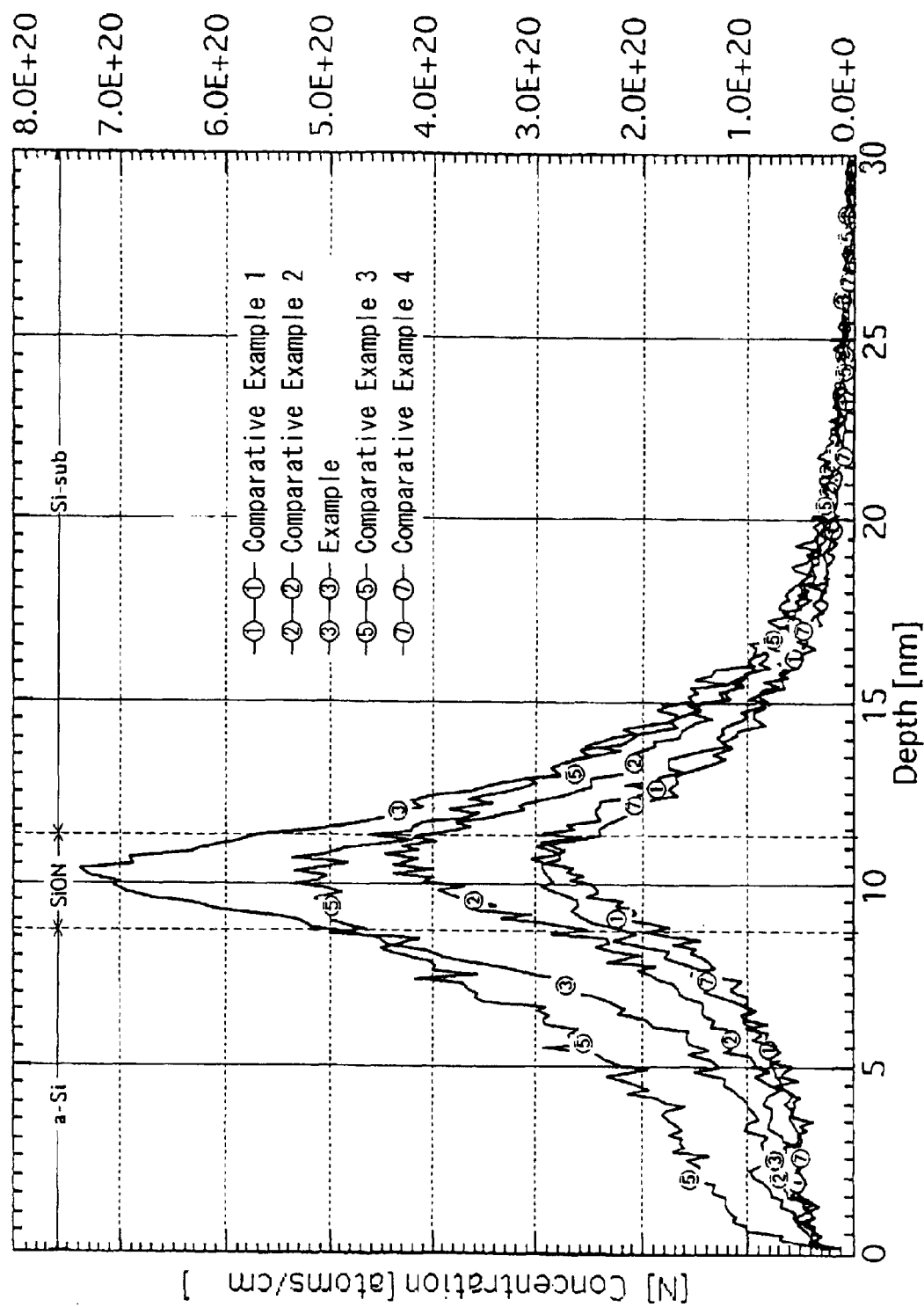
FIG. 8 shows, on a linear scale, the results of measuring, by SIMS, the distributions of nitrogen concentration in the silicon oxynitride films and their vicinities according to Example and Comparative Examples.

FIGS. 7 and 8 shows the results of measuring, by SIMS, the distributions of nitrogen concentration (atoms/cm$^3$) in the silicon oxynitride films and their vicinities according to Example and Comparative Examples. In FIG. 7, the horizontal axis represents the direction of depth in cross section and the vertical axis represents nitrogen concentration (on a logarithmic scale). FIG. 8 shows the same data as shown in FIG. 7 by using a linear scale to express the concentration which is represented by the vertical axis. In each of the drawings, ①, ②, ③, and ⑦ indicate samples prepared by the following treatments in each of which amorphous silicon is deposited on a silicon oxynitride film with a thickness of 2.6 nm.

①: Comparative Example 1

The sample was prepared by performing a heat treatment at 1000° C., while keeping a surface of a Si substrate as an underlie in contact with an N$_2$O gas, and thereby oxynitriding silicon to form an oxynitride film (the conventional p-channel MOS transistor in a mid-step of the fabrication process from which the data shown in FIG. 4(*a*) and FIGS. 5 and 6 was obtained)

②: Comparative Example 2

The sample was prepared by performing a heat treatment at 1000° C., while keeping a surface of a Si substrate as an underlie in contact with an N$_2$O gas, thereby oxynitriding silicon to form an oxynitride film (prepared by further performing a heat treatment at 800° C., while keeping a surface of the sample of Comparative Example 1 in contact with an NO gas (NO gas annealing)).

③: Example

The sample was prepared by performing a heat treatment at 1000° C., while keeping a surface of a Si substrate as an underlie in contact with an N$_2$O gas, thereby oxynitriding silicon to form an oxynitride film (prepared by further performing a heat treatment at 900° C., while keeping a surface of the sample of Comparative Example 1 in contact with an NO gas (NO gas annealing)).

⑤: Comparative Example 3

The sample was prepared by performing a heat treatment, while keeping a surface of a Si substrate as an underlie in contact with a gas mixture of O$_2$ and NO (containing 30% of NO gas), and thereby oxynitriding silicon to form an oxynitride film.

⑦: Comparative Example 4

The sample was prepared by performing a heat treatment, while keeping a surface of a Si substrate as an underlie in contact with a gas mixture of O$_2$ and NO (containing 10% of NO), and thereby oxynitriding silicon to form an oxynitride film.

In each of FIGS. 7 and 8, "a-Si" indicates an amorphous silicon film, "SiON" indicates a silicon oxynitride film, and "Si-sub" indicates a Si substrate. The two broken lines in each of the drawings represents the interface between the amorphous silicon film and the silicon oxynitride film and the interface between the silicon oxynitride film and the Si substrate.

As shown in FIG. 8, the nitrogen concentration in the sample ①, which was the conventional silicon oxynitride film prepared in Comparative Example 1, has a peak at a point close to the interface between the silicon oxynitride film and the Si substrate. Since the distribution of nitrogen concentration presents a gently sloped configuration, if the impurity concentration is increased to such a degree as to prevent the penetration of the impurity, the nitrogen concentration in the amorphous silicon film and in the Si substrate is expected to be higher.

By contrast, the nitrogen concentration in the sample ③ prepared in Example in accordance with the method of the present embodiment has a peak value at a point located adjacent the middle portion of the silicon oxynitride film and the distribution of nitrogen concentration presents a steeply sloped configuration. The nitrogen concentration in the silicon oxynitride film of the sample ③ of Example is about 8 atom %. It has also been proved that, if the peak of the nitrogen concentration in the silicon oxynitride film has a value on the order of the peak value in the sample ③ of Example shown in FIG. 8, the penetration of boron can be prevented. If the nitrogen concentration is excessively higher than 8 atom %, the transistor characteristics may be adversely affected.

If NO gas annealing is performed at 800° C. as in the sample ② of Comparative Example 2, the peak of the nitrogen concentration remains at a point adjacent the interface between the silicon oxynitride film and the Si substrate, so that the configuration of the distribution is not steeply sloped, either. As a result of forming a MIS transistor from the sample of Comparative Example 2, it was found that the driving force was lower than that of a MIS transistor formed from the sample ③ of Example.

When the temperature for performing NO gas annealing with respect to a silicon oxynitride film was set to 1000° C., though the data obtained at that temperature is not shown in FIGS. 7 and 8, it was found that the configuration of the distribution is more steeply sloped than in the sample ① of Example and characteristics associated with the short-channel effects, driving force, and the like of the MIS transistor were excellent.

In the case of forming a silicon oxynitride film directly from a Si substrate by using a gas mixture Of O$_2$ and NO containing NO in a high proportion, as in the sample ⑤ of Comparative Example 3, the peak of the nitrogen concentration is located at a nearly middle portion in the direction of thickness of the silicon oxynitride film but the nitrogen concentration is higher in a portion closer to the amorphous silicon film. As a result of forming a MIS transistor from the sample ⑤ Comparative Example 3, it was found that the driving force was lower than that of a MIS transistor formed from the sample ③ of Example.

From the foregoing results, it can be considered that, by performing the NO gas annealing of the present invention with respect to a silicon oxynitride film, the nitrogen concentration is distributed into a steeply sloped configuration such that nitrogen exists at a high concentration in the silicon oxynitride film, which suppresses the penetration of boron into the Si substrate 10 and provides a high driving force.

In the conventional step of forming a silicon oxynitride film, the silicon oxynitride film is formed directly from the silicon substrate or by nitriding the silicon oxide film. In accordance with the conventional method, however, the distribution of nitrogen concentration in the silicon oxynitride film has a gently sloped configuration. Since nitrogen is distributed continuously not only in the silicon oxynitride film but also in the gate electrodes (amorphous silicon film) on both sides and in the Si substrate, the gently sloped distribution of nitrogen concentration leads to the entrance of nitrogen at a relatively high concentration into the gate electrodes and also into the Si substrate if nitrogen at a concentration required to suppress boron penetration is to be contained in the silicon oxynitride film. As a result, the driving force of the transistor is assumedly reduced by an increase in gate resistance in the gate electrodes or by a reduction in the mobility of carriers in the channel region of the Si substrate.

If the nitrogen concentration has a peak at a point adjacent the interface with the Si substrate, in particular, the probability is high that the driving force of the transistor has been reduced by an increased nitrogen concentration in the Si substrate.

By contrast, the present embodiment allows additional introduction of high-concentration nitrogen by performing No gas annealing with respect to the silicon oxynitride film, while providing a steeply sloped nitrogen distribution in the silicon oxynitride film. As a consequence, the driving force of the transistor can be held high, while the short-channel effects are suppressed by effectively preventing boron penetration. In summary, the suppression of the short-channel effects in a p-channel MIS transistor is achievable simultaneously with an improvement in driving force.

Judging from the results of the experiments conducted by the present inventors, the heat treatment temperature during the NO gas annealing is preferably higher than 800° C. and not higher than 1050° C.

The structure of the p-channel MIS transistor is not limited to a SAC structure as shown in FIG. 2(c). However, since the stress resulting from the nitride film sidewalls 16a is exerted on the gate electrodes 13a or the like in the p-channel MIS transistor with the SAC structure shown in FIG. 2(c), boron in the gate electrodes 13a is particularly likely to enter the Si substrate 10. By applying the present invention to the p-channel MIS transistor with the SAC structure, therefore, a structure particularly suitable for miniaturization is obtained.

Other Embodiments

Although the foregoing embodiment has performed annealing while keeping the surface of the silicon nitride film in contact with the NO gas (NO gas annealing), effects equal to those achieved in the foregoing embodiment are also achievable by performing annealing while keeping a silicon oxynitride film in contact with another gas containing oxygen and nitrogen, such as an $N_2O$ gas or $NO_2$ gas.

Although the foregoing embodiment has described the annealing process in the case of using the silicon oxynitride film as a gate insulating film provided under the gate electrode of the MIS transistor, the present invention is not limited to such an embodiment and is also applicable to a device such as a MIS capacitor or a TFT transistor.

The present invention is also applicable to a MIS transistor or MIS capacitor using a SOI substrate.

What is claimed is:

1. A method of fabricating a semiconductor device, the method comprising the steps of:

(a) forming a silicon oxynitride film on a silicon substrate;

(b) performing a heat treatment while keeping a surface of the silicon oxynitride film in contact with a gas containing nitrogen and oxygen to introduce at least nitrogen into the silicon oxynitride film;

(c) after step (b), forming a semiconductor film containing an impurity of first conductivity type on the silicon oxynitride film;

(d) after step (c), forming a protecting film for the gate on the semiconductor film;

(e) after step (d), forming a protecting layer on the gate composed of the protecting film for the gate and a gate electrode composed of the semiconductor film by patterning the protecting film for the gate and the semiconductor film;

(f) forming a first side wall with a L-shape cross sectional view on the sides of the gate electrode and the protecting layer on the gate, and a second side wall that spreads over the side and the base of the first side wall;

(g) after step (f), forming a gate insulating film composed of the silicon oxynitride film by patterning the silicon oxynitride film, wherein the gate insulating film has a nitrogen concentration peak formed at around the center portion of the silicon oxynitride film.

2. The method of claim 1, wherein the silicon oxynitride film is formed by concurrently applying an $N_2O$ gas and performing a heat treatment to the surface of the silicon substrate in step (a).

3. The method of claim 1, wherein the step (c) includes the substeps of:

forming, as the semiconductor film an amorphous silicon film on the silicon oxynitride film;

implanting impurity ions into the amorphous silicon film; and performing a heat treatment for activating the impurity to change the amorphous film into a polysilicon film.

4. The method of claim 1, wherein the heat treatment is performed at 800 to 1050° C. in the step (b).

5. The method of claim 1, wherein an NO gas is used as the gas containing nitrogen in the step (b).

6. The method of claim 1, wherein the $N_2O$ gas is used as the gas containing nitrogen in the step (b).

7. The method of any one of claims 1 to 4, and 5 to 6, wherein the semiconductor device is a p-channel MIS transistor and a silicon film for a gate electrode containing boron is formed as the semiconductor film in step (c).

* * * * *